United States Patent
Sung et al.

(10) Patent No.: US 8,664,039 B2
(45) Date of Patent: Mar. 4, 2014

(54) METHODS AND APPARATUS FOR ALIGNMENT IN FLIP CHIP BONDING

(75) Inventors: Ming-Chung Sung, Taichung (TW); Yu-Chih Liu, Taipei (TW); Wei-Ting Lin, Taipei (TW); Chien-Hsiun Lee, Chu-tung Town (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 193 days.

(21) Appl. No.: 13/276,162

(22) Filed: Oct. 18, 2011

(65) Prior Publication Data

US 2013/0095607 A1   Apr. 18, 2013

(51) Int. Cl.
   *H01L 21/50* (2006.01)
(52) U.S. Cl.
   USPC .............. 438/106; 438/108; 257/E21.499
(58) Field of Classification Search
   USPC ............... 438/106, 108; 257/E21.499
   See application file for complete search history.

(56) References Cited

U.S. PATENT DOCUMENTS

| | | | |
|---|---|---|---|
| 6,734,568 B2 * | 5/2004 | Matsuo et al. | 257/781 |
| 7,989,359 B2 * | 8/2011 | Okayama et al. | 438/773 |
| 2011/0254945 A1 * | 10/2011 | Kikuchi et al. | 348/126 |
| 2012/0291950 A1 * | 11/2012 | Sugiyama et al. | 156/285 |

* cited by examiner

*Primary Examiner* — Trung Q Dang
(74) *Attorney, Agent, or Firm* — Slater & Matsil, L.L.P.

(57) ABSTRACT

Methods and apparatus for alignment in a flip chip bonding. A method includes attaching an integrated circuit having connector terminals to a bonding arm, the bonding arm having a chuck for attaching the integrated circuit at the backside surface, the bonding arm having a plurality of CCD imagers mounted thereon; receiving a substrate having pads corresponding to the connector terminals; using the bonding arm, positioning the integrated circuit proximal to the substrate; aligning the integrated circuit connector terminals with the pads on the substrate using the CCD imagers on the bonding arm; positioning the connector terminals in contact with the pads on the substrate; and performing a solder reflow to attach the integrated circuit to the substrate. An apparatus includes a bonding arm with a chuck for carrying a component and CCD imagers mounted on the arm for alignment.

17 Claims, 5 Drawing Sheets

METHODS AND APPARATUS FOR ALIGNMENT IN FLIP CHIP BONDING

BACKGROUND

A common requirement for semiconductor processing and advanced packaging of integrated circuit is assembly of integrated circuit dies to a substrate to form a completed device. The integrated circuit dies typically include active and passive circuit devices, such as transistors and capacitors, fabricated in a semiconductor process. A plurality of connector terminals are formed on the active surface of the integrated circuit dies. The assembly of the dies to the substrates requires that the integrated circuit dies be separated from a semiconductor wafer; the integrated circuit die is then mounted with the respective connector terminals forming electrical and physical connections to corresponding pads or lands on a substrate.

In the conventional assembly process, "flip chip" bonding is performed. Individual integrated circuit dies are fabricated on a semiconductor wafer in a semiconductor process. The dies are then separated from a semiconductor wafer by a wafer dicing or "singulation" process. The integrated circuit dies are then removed from a wafer mount tape or other support by a "pick and place" tool. The substrate has lands or pads configured to align with the integrated circuit die connector terminals. The two pieces are aligned and then brought together in physical contact and then the solder reflow process is used to electrically and physically couple the connector terminals of the integrated circuit to the pads on the substrate.

In the known flip chip approaches, several problems are encountered. Alignment of the integrated circuit die, which is carried in a "flipped" position by a bonding tool with the substrate, which is positioned face up and disposed beneath the integrated circuit die, is difficult and takes several steps. Several separate optical lenses are used, such as charge coupled device (CCD) optical sensors or cameras, to align the two pieces prior to bonding. In order to achieve precise alignment the component carrying head, the substrate carrying tool, or both, may move back and forth several times, substantially slowing the throughput for the chip attach process. Component alignment and bonding to the substrate limits the maximum throughput that may be achieved, increasing per unit costs.

BRIEF DESCRIPTION OF THE FIGURES

For a more complete understanding of the present disclosure, and the advantages thereof, reference is now made to the following descriptions taken in conjunction with the accompanying drawings, in which.

The drawings, schematics and diagrams are illustrative and not intended to be limiting, but are examples of embodiments of the disclosure, are simplified for explanatory purposes, and are not drawn to scale.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present application, which are now described in detail, provide novel methods and apparatus for manufacturing semiconductor devices including providing a method for aligning flip chip dies and substrates prior to bonding with a minimum of delay and processing time, increasing throughput and lowering cost over known approaches.

Figure 1:
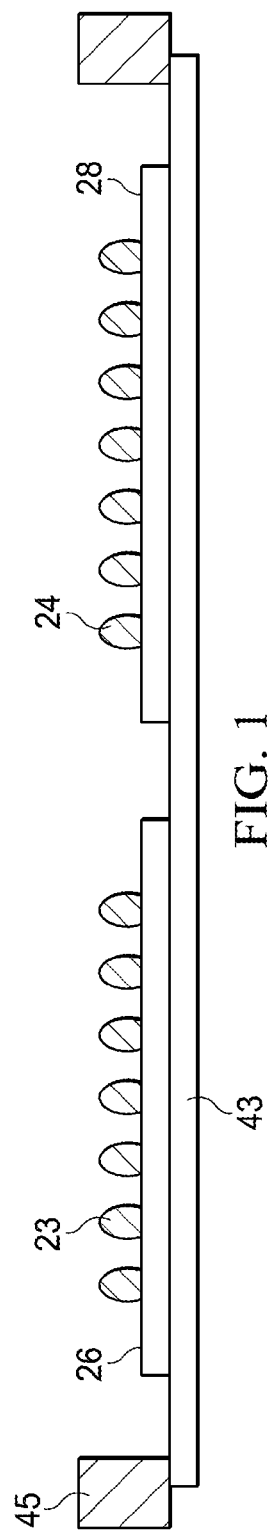
FIG. 1 depicts in a cross sectional view integrated circuit dies on a semiconductor wafer after dicing, for use with the embodiments.

FIG. 1 depicts in a cross sectional view an embodiment device 11 including two integrated circuits 26 and 28 formed from a semiconductor wafer. At the intermediate stage of processing illustrated here, the semiconductor wafer including integrated circuits 26 and 28 are mounted to a wafer mount tape 43 and supported in a frame 45 which holds the tape and the dies. Connector terminals 23 are shown on the active surface of the integrated circuit dies, which are arbitrarily oriented in a "face up" position as shown in FIG. 1. The backside of the integrated circuits 26 and 28, which was the backside of the semiconductor wafer, is mounted to the wafer mount tape 43. The connector terminals 23 may be of various types including as non-limiting examples controlled collapse chip connectors ("C4"), gold studs or pillars, copper pillars or columns, and/or solder pillars, balls or bumps may be used as alternative embodiments to form the connector terminals. Technologies such as wafer bumping, electroplating, and electro-less plating, may be used. Often the connector terminals may be formed as lead free solder bumps or balls, such as Sn—Ag—Cu or other eutectic compositions. These connector terminals form the external electrical connectors to the active and passive circuit devices fabricated on the semiconductor wafer. The connector terminals extend away from the semiconductor wafer surface as shown in FIG. 1. The shapes of these terminals may include columns, pillars, ovals, spheres, or other shapes.

Figure 2:
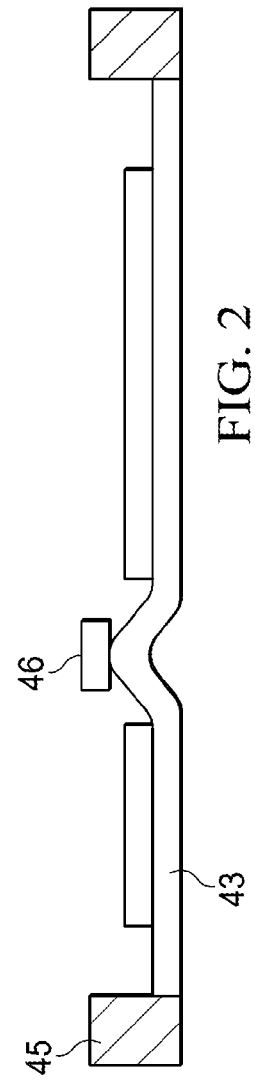
FIG. 2 depicts in a cross sectional view a process for removing an integrated circuit die from the semiconductor wafer of FIG. 1.

FIG. 2 depicts in cross section the device 11 of FIG. 1 in a further processing step. In FIG. 2, an operation to remove one of the integrated circuit dies from the wafer mount tape 43 is depicted. The tape 43 is elevated or stretched in a small portion beneath the integrated circuit die. This pushes one die 46 above the remaining ones and makes that unit easy to physically attach to.

Figure 3:
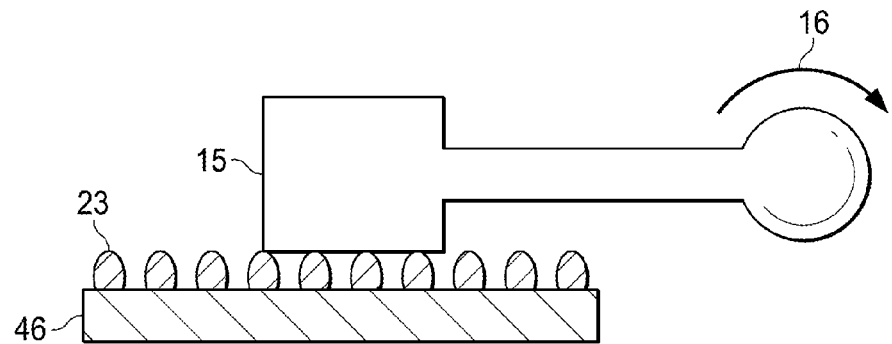
FIG. 3 depicts in a cross sectional view an integrated circuit die being loaded onto a pick and place tool for additional process steps.

FIG. 3 depicts in a cross-sectional view the operation of a "chip flipper" 15. This tool allows the selection of a single integrated circuit as the component to be processed and turns it over, or flips it, so that the connector terminals will be oriented facing a substrate. Chip flipper 15 may use a vacuum tool to attach gently to the component and, as shown by arrow 16 in FIG. 3, may rotate about an axis to turn the component 46 over. Other tools could be used to flip the component; as well.

Figure 4:
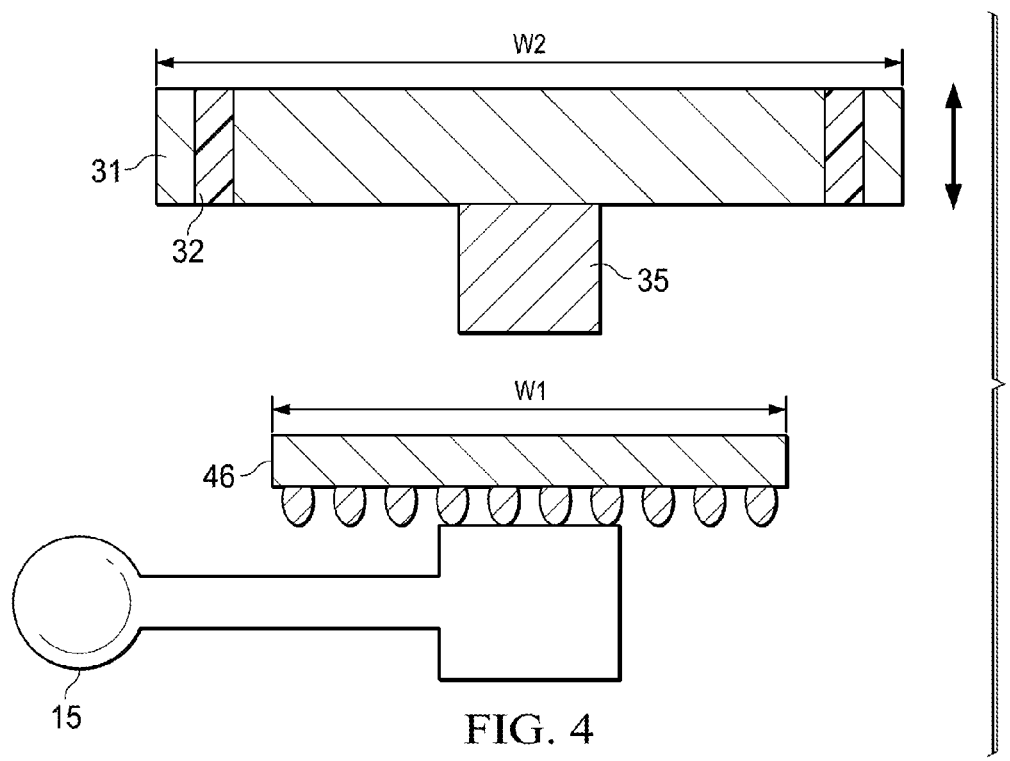
FIG. 4 depicts in a cross sectional view an embodiment for attaching an integrated circuit die to a bonding arm of the embodiments in an additional process step.

FIG. 4 depicts in a cross sectional view additional processing steps of an embodiment. In FIG. 4, a bonding arm 31 is shown in cross section with CCD imagers 32 on each end. The bonding arm 31 has includes a component chuck 35 which includes a vacuum, electrostatic or other attachment method. In FIG. 4, the bonding arm 31 is shown picking a component, integrated circuit 46 in this example, from the chip flipper 15. The bonding arm is shown moving in the Y direction, to make contact with the backside of the component 46, but the arm also can move in all three dimensions x, y, and z and may rotate about the y axis, for example.

In the embodiments, the bonding arm 31 includes CCD imagers 32 mounted proximal to the ends. The CCDs 32 may be permanently installed during the manufacture of the arm or attached later. While the dimensions of the bonding arm 31 are not critical, the CCDs 32 must be placed so that the downward view is not obstructed by the component 46. That is, the width W2 in FIG. 4 must be sufficiently greater than the width of the component 46, labeled W1, to allow the imagers to look downward and see objects positioned below the component; as will be explained further below. A die fabricated using current process technologies may be as large as 50 millimeters on one side, so the bond head 31 should have a width W2 greater than 50 millimeters for those dies, although for other smaller dies, smaller bond head widths may be used as well.

In operation as shown in FIG. 4, the bonding arm component chuck 35 is brought into contact with the component 46 and a vacuum or other attachment is used to attach the component 46 to the chuck. Chip flipper 15 then releases the component 46 and is moved from the component. After the component 46 is attached to the chuck 35, the bonding arm 31 may be used to both move the component 46 and to perform additional processing.

Figure 5:
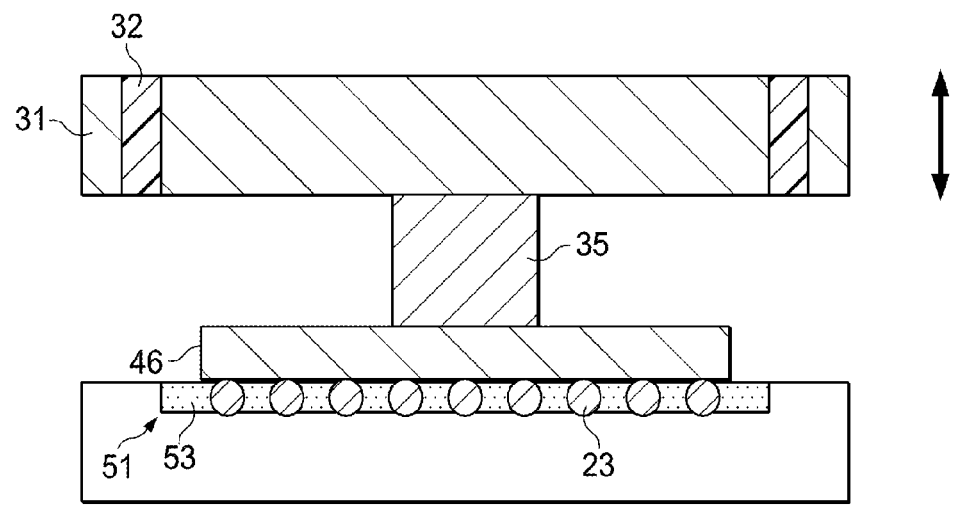
FIG. 5 depicts in a cross sectional view a process of providing flux to an integrated circuit die in an additional process step.

FIG. 5 depicts in a cross-sectional view a flux dipping operation using the bonding arm 31 to move the component 46. In FIG. 5 a reservoir 51 contains flux 53. In a dipping operation, the flux 53 is applied to the connector terminals 23 and may cover a portion of each terminal to enable the solder reflow process to form good connections to the substrate as is described later.

Figure 6:
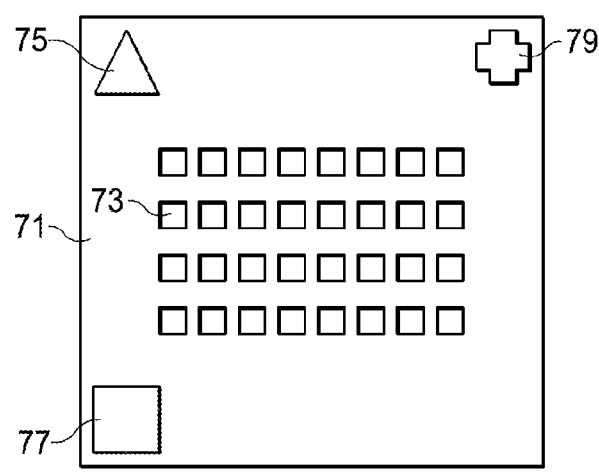
FIG. 6 depicts in a plan view a substrate for use with the embodiments.

A substrate for receiving the component 46 is also subjected to a flux treatment, separately, before the bonding is performed. FIG. 6 depicts in a top view an example substrate 71 with lands 73 which correspond to connector terminals on a component to be mounted. Three fiducial marks are shown on the face of substrate 71 labeled 75, 77 and 79. Note that as arranged, each corner of the substrate 71 may be easily identified by the presence or absence of a fiducial mark, and if one is present, the particular shape of the fiducial mark is different for each corner. The substrate 1 may be any substrate material used in packaging of electronic components including without limitation ceramics, BT resin, FR4, organic, films, tapes, silicon, semiconductor wafers, interposers, or even other integrated circuits when the embodiments are used for circuit stacking applications.

Figure 7:
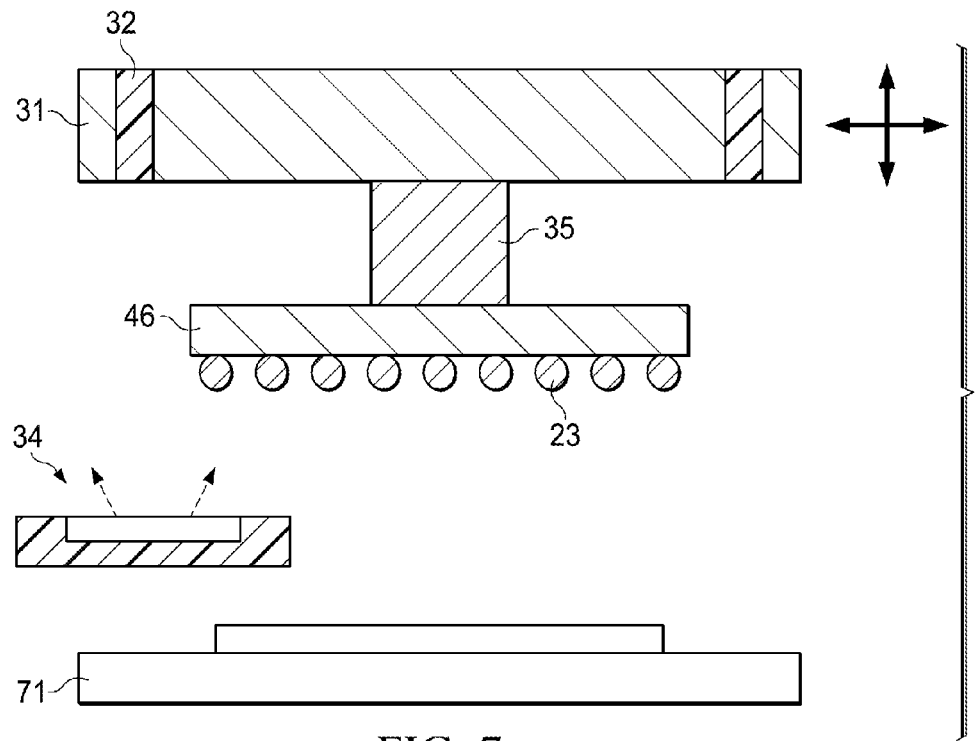
FIG. 7 depicts in in a cross sectional view a method embodiment for aligning the integrated circuit die with a substrate.

FIG. 7 depicts the operation of one embodiment of the alignment system. In FIG. 7, the bonding arm 31 carries component 46. Prior to a bonding process, an imager 34 may be used to verify that the component 46 is properly mounted on the chuck 35. The CCD imager 34 looks upward (in this illustrative, non-limiting example) to verify the component is still attached to the chuck 35, before the chuck is positioned and forced downward on the substrate. Other orientations for imager 34 could also be used.

In the system of FIG. 7, the substrate 71 is placed on a wafer stage which can include the ability to move substrate 71 for alignment. The bonding arm 31 can move in several directions and is aligned above the substrate 71 using the CCD imagers 32. The component 46 is then moved downward on the substrate 71 and force is used to contact the connector terminals 23 to the pads 73 (not shown in FIG. 7) on the substrate.

The CCD imagers 32 on the bonding arm 31 look downward (in this illustrative, non-limiting example) towards the substrate and may be used to align the component 46 with the substrate 71. The alignment of the substrate 71 may be detected automatically or semi-automatically by an imaging system which may use pattern recognition software, with or without aid of a human operator, to align the bonding arm 31 and the component 46 with the substrate 71. Because the CCD imagers 32 are part of and move with the bonding arm 31, the alignment process is fast and accurate as compared to the prior known systems.

In the prior known systems, several imaging systems are used to align the bonding arm and component to the substrate 71. First a CCD imager is used to identify the substrate position using the fiducial marks. Then another different CCD imager is used to check the component centering and position. Finally, a third CCD imager with up looking and down looking portions is placed between the component and the substrate. The third CCD imager was placed between the two pieces and the component and substrate were moved to align them. However the component alignment is affected by the motor vibration of the CCD imager and thus, the alignment is necessarily again checked. Because the motor vibration can change the alignment, this process continues iteratively until the final alignment is achieved. This process can take several iterations and is very slow.

In addition in the prior approaches, the component placement identification requires recognition of the pattern of the connector terminals, which may be for example, solder bumps. If the flux process results in a flux spread pattern around some of the solder bumps, recognition of the solder bump pattern may be impaired.

In contrast to the known approaches, the method embodiments presented here use CCD imagers mounted on the bonding arm outside the pattern of the component, so that they may look down past the component. Because the position of the component relative to the CCD imagers 32 is known, the use of the solder bump pattern to identify the component placement is not needed. The use of the look up and look down CCD imager being moved between the component and the substrate is eliminated. The die shift or substrate shift that occurs due to the motor vibration of the prior art look up and look down CCD sensor is also eliminated, which speeds alignment. The use of the fiducial marks on the substrate to identify the substrate orientation is not required and this further saves time and increases accuracy.

Figure 8:
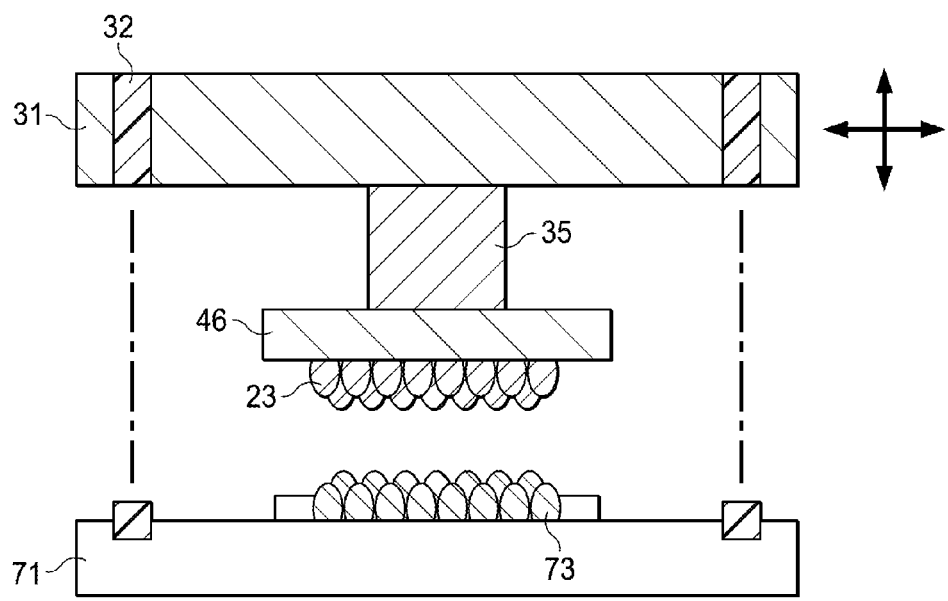
FIG. 8 depicts in a cross sectional view the method embodiment of FIG. 7 in greater detail.

FIG. 8 depicts in cross section the bonding arm 31 and the component 46 in the bonding operation of the embodiments. The CCD imagers 32 sense the substrate 71 position and using the relative positions, the component 46 is aligned to the pattern on the substrate 71. The bonding arm 31 moves downward and places the connector terminals 23 in position and in physical contact with the respective pads 73 on substrate 71.

In an alternative embodiment, the bonding arm 31 further includes laser transmitters. The lasers may be used to illuminate a portion of the substrate 71 and the reflections may be observed by the CCD imagers 32 to further increase the accuracy of the system.

The CCDs 32 are placed on the bonding arm 31 in a manner such that the component 46 does not block the view looking downwards from the bonding arm 31. The bonding arm 31 is therefore wider than the component 46 so that the imagers 32 are not blocked from the view of the substrate 71. In an embodiment at least two CCD imagers are placed at either end of the bonding arm 31 as shown. In further embodiments additional CCD imagers may be used.

Figure 9:
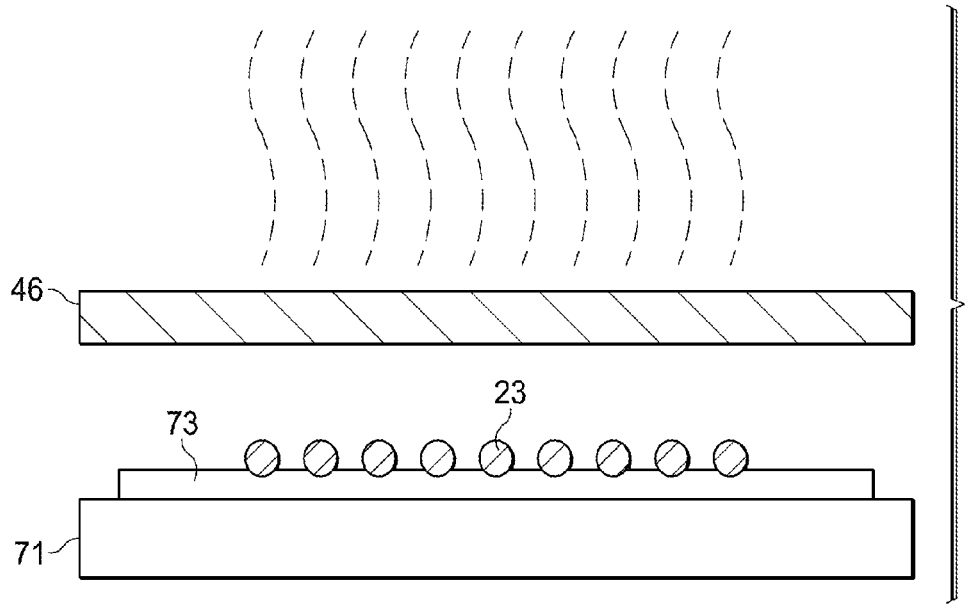
FIG. 9 depicts in a cross sectional view a solder reflow step following the alignment of FIGS. 7 and 8.

FIG. 9 depicts in a cross-sectional view the reflow process that bonds the component 46 to the substrate 71. The connector terminals 23, which now have flux on them, are placed in physical contact with the pads on substrate 73, which also have flux applied, and thermal energy 91 is applied to reflow the solder. The thermal energy may be in the form of halogen lights, UV, an oven, or other energy for reflow. The reflow temperatures used may be up to 450 degrees C., for example.

Figure 10:
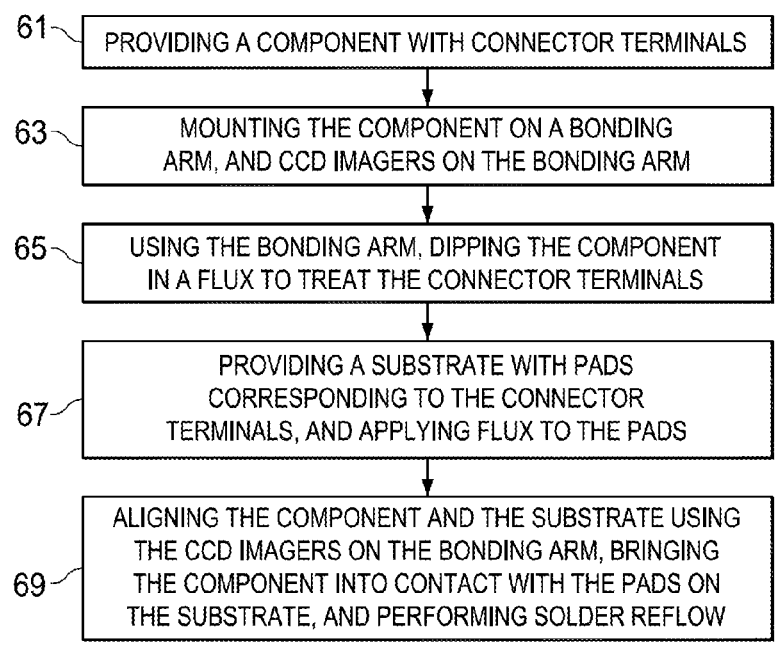
FIG. 10 depicts in a process flow diagram selected steps for an embodiment method.

FIG. 10 depicts in a flow diagram the steps of an embodiment. In step 61, a component is provided including connector terminals formed on an active surface. In an embodiment the component may be an integrated circuit, for example, although it could be any component to be mounted on a substrate, including interposers, passive components, and the like.

In step 63, the component is mounted on a bonding arm that includes CCD imagers mounted on the bonding arm. As described above the component may be mounted in a "face down" orientation, although this is used for convenience for this description, a "face up" orientation could also be used. The bonding arm may contact the component on the backside using a vacuum chuck or electrostatic chuck to attach the component to the bonding arm.

In step 65, the component is dipped in flux to place flux on the connector terminals.

In step 67, a substrate having pads corresponding to the connector terminals is provided, and flux is applied to the pads.

In step 69, the CCD imagers on the bonding arm are used to align the substrate and the component, and the parts are brought into contact. A solder reflow is then performed to attach the component to the substrate. The substrate may be any convenient substrate used in packaging of electronic components including ceramics, BT resin, FR4, organic, films, silicon, semiconductor wafers, or other integrated circuits for circuit stacking applications.

Use of the embodiments speeds the component attach operations in a solder reflow process, such as used for flip chip assembly. The use of the CCD imagers on the bonding arm eliminates the need for the substrate fiducial identification and the solder bump pattern recognition used in prior known systems. The identification errors observed in prior systems caused by flux spread around the connector terminals or solder bumps is overcome, as the embodiments do not rely on this identification approach. The die shift alignment problems caused by motor vibration during the look up and look down CCD sensor examination of the prior approach is eliminated, which also eliminates the iterative back and forth motions observed during alignment in prior systems. Alignment time is reduced and throughput is increased by use of the embodiments.

In an embodiment, a method is provided including receiving an integrated circuit having connector terminals on an active surface and having a backside surface; attaching the integrated circuit to a bonding arm, the bonding arm having a chuck for attaching the integrated circuit at the backside surface, the bonding arm having a plurality of CCD imagers mounted thereon and looking toward the integrated circuit and past the integrated circuit; using the bonding arm, coating the connector terminals with flux; receiving a substrate having pads corresponding to the connector terminals; using the bonding arm, positioning the integrated circuit proximal to the substrate; aligning the integrated circuit connector terminals with the pads on the substrate using the CCD imagers on the bonding arm; positioning the connector terminals in contact with the pads on the substrate; and performing a solder reflow to attach the integrated circuit to the substrate.

In an alternative method, the above method includes providing flux on the pads of the substrate. In a further alternative, the above methods include the connector terminals comprising solder bumps. In yet another embodiment, the methods include connector terminals that are controlled collapse chip connectors. In still another embodiment, the above methods include connector terminals that comprise copper pillars. In yet another embodiment the above methods include attaching the integrated circuit to the bonding arm by picking an integrated circuit die from a wafer mount tape in a face up position using a vacuum tool; rotating the vacuum tool to place the integrated circuit die in a face down position; and using a vacuum chuck on the bonding arm, attaching the bonding arm to the backside of the integrated circuit die. In another embodiment, the above methods are performed while the integrated circuit has a first width, and the bonding arm has a maximum width greater than the first width. In yet another embodiment the above methods are performed wherein the CCD imagers are placed on the bonding arm spaced apart by a width greater than the first width. In still another embodiment the methods above include placing laser transmitters on the bonding arm. In another embodiment, the above methods are performed wherein aligning further comprises using the laser transmitters to transmit laser beacons to the substrate, with the CCD imagers receiving the laser reflections.

In another alternative embodiment, a method includes receiving a component for flip chip mounting, the component having connector terminals on an active surface and having a backside surface; picking the component up by attaching a pick and place tool to the active surface; rotating the component to expose the backside surface; attaching a bonding arm to the backside of the component, the bonding arm including CCD imagers mounted on the bonding arm outside of the area of the bonding arm that overlies the component; using the CCD imagers, aligning the component to a substrate, the active surface of the component facing an active surface of the substrate; positioning the connector terminals on the component in contact with corresponding pads on the substrate; and performing a solder reflow to attach the component to the substrate. In another embodiment, the above method further includes receiving an integrated circuit as the component. In yet another embodiment, the above methods further include applying a flux to the connector terminals of the component prior to the alignment step. In still another embodiment, the above methods are performed wherein the connector terminals comprise solder balls.

In still another embodiment, an apparatus includes a bonding arm having a chuck configured to attach to a component for flip chip bonding, the bonding arm further comprising CCD imagers mounted to the bonding arm outside of the area of the component, configured to perform alignment of a component with a substrate. In a further embodiment, the above apparatus includes a plurality of laser transmitters mounted on the bonding arm. In still another embodiment, the above apparatus includes the plurality of CCD imagers comprises at least two CCD imagers spaced apart by a width greater than the width of a component.

The scope of the present application is not intended to be limited to the particular illustrative embodiments of the structures, methods and steps described in the specification. As one of ordinary skill in the art will readily appreciate from the disclosure of the present disclosure, processes, or steps, presently existing or later to be developed, that perform substantially the same function or achieve substantially the same result as the corresponding embodiments described herein may be utilized according to the present disclosure. Accordingly, the appended claims are intended to include within their scope such processes or steps.

What is claimed is:

1. A method, comprising:
   receiving an integrated circuit having connector terminals on an active surface and having a backside surface;
   attaching the integrated circuit to a bonding arm, the bonding arm having a chuck for attaching the integrated circuit at the backside surface, the bonding arm having a plurality of CCD imagers mounted thereon and looking toward the integrated circuit and past the integrated circuit;
   receiving a substrate having pads corresponding to the connector terminals;
   using the bonding arm, positioning the integrated circuit proximal to the substrate;
   aligning the integrated circuit connector terminals with the pads on the substrate using the CCD imagers on the bonding arm;
   positioning the connector terminals in contact with the pads on the substrate; and
   performing a solder reflow to attach the integrated circuit to the substrate.

2. The method of claim 1, and further comprising providing flux on the pads of the substrate.

3. The method of claim 1 wherein the connector terminals comprise solder bumps.

4. The method of claim 1 wherein the connector terminals comprise controlled collapse chip connectors.

5. The method of claim 1 wherein the connector terminals comprise copper pillars.

6. The method of claim 1 and wherein attaching the integrated circuit to the bonding arm further comprises:
   picking an integrated circuit from a wafer mount tape in a face up position using a vacuum tool;
   rotating the vacuum tool to place the integrated circuit in a face down position; and
   using a vacuum chuck on the bonding arm, attaching the bonding arm to the backside of the integrated circuit.

7. The method of claim 1, wherein the integrated circuit has a first width, and the bonding arm has a maximum width greater than the first width.

8. The method of claim 7, wherein the CCD imagers are placed on the bonding arm spaced apart by a width greater than the first width.

9. The method of claim 1, and further comprising placing laser transmitters on the bonding arm.

10. The method of claim 9, wherein aligning further comprises using the laser transmitters to transmit laser beacons to the substrate, with the CCD imagers receiving the laser reflections.

11. The method of claim 1 wherein the plurality of CCD imagers on the bonding arm comprises at least two CCD imagers.

12. The method of claim 1, wherein aligning the integrated circuit connector terminals with the pads on the substrate using the CCD imagers on the bonding arm is performed automatically.

13. The method of claim 1, wherein aligning the integrated circuit connector terminals with the pads on the substrate using the CCD imagers on the bonding arm is performed manually.

14. A method, comprising:
   receiving a component for flip chip mounting, the component having connector terminals on an active surface and having a backside surface;
   picking the component up by attaching a pick and place tool to the active surface;
   rotating the component to expose the backside surface;
   attaching a bonding arm to the backside of the component, the bonding arm including CCD imagers mounted on the bonding arm outside of the area of the bonding arm that overlies the component;
   using the CCD imagers, aligning the component to a substrate, the active surface of the component facing an active surface of the substrate;
   positioning the connector terminals on the component in contact with corresponding pads on the substrate; and
   performing a solder reflow to attach the component to the substrate.

15. The method of claim 14, wherein receiving a component further comprises receiving an integrated circuit.

16. The method of claim 14, and further comprising applying a flux to the connector terminals of the component prior to the step of aligning.

17. The method of claim 14, wherein the connector terminals comprise solder balls.

* * * * *